United States Patent [19]

Kubota et al.

[11] Patent Number: 4,906,195
[45] Date of Patent: Mar. 6, 1990

[54] BUILT-IN FUNCTION TYPE WIRING APPARATUS

[75] Inventors: Mitsuji Kubota; Hiroshi Suzuki; Toru Takahashi, all of Kosai, Japan

[73] Assignee: Yazaki Corporation, Japan

[21] Appl. No.: 193,654

[22] Filed: May 13, 1988

[30] Foreign Application Priority Data

Jul. 15, 1987 [JP] Japan .............................. 62-107511[U]

[51] Int. Cl.$^4$ ................................................ H01R 9/09
[52] U.S. Cl. ........................................ 439/76; 361/399
[58] Field of Search .............................. 439/55, 76, 78; 361/395–399, 412, 415

[56] References Cited

U.S. PATENT DOCUMENTS 4,603,930 8/1986 Ito .......................................... 439/78
4,685,753 8/1987 Isshiki et al. ........................... 439/76
4,703,397 10/1987 Minoura et al. ...................... 361/399

FOREIGN PATENT DOCUMENTS 62-59543 4/1987 Japan .

Primary Examiner—Neil Abrams
Attorney, Agent, or Firm—Wigman & Cohen

[57] ABSTRACT

A wiring apparatus of a function embedded type comprises a circuit unit having a functional circuit and a signal circuit for inputting and outputting signals through external wire harnesses; a junction block including a bus bar circuit having a branch function; first and second connectors being respectively disposed in the circuit unit and the junction block, the signal circuit being connected onto the junction block side through the first and second connectors with respect to an external wire harness with no route of the bus bar circuit; and a third connector for an external wire harness of the signal circuit, disposed on the junction block side in proximity to the second connector.

6 Claims, 5 Drawing Sheets

BUILT-IN FUNCTION TYPE WIRING APPARATUS

The present invention relates to an improvement of a built-in function wiring apparatus used in an electrical circuit in a vehicle to simplify an inner circuit of an electronic circuit unit connected to a junction block and reduce the number of parts.

BACKGROUND OF THE INVENTION

FIGS. 1 and 2 show a conventional built-in function type wiring apparatus. In these figures, an electronic circuit unit 11 is mainly composed of a functional circuit 11a for transmitting signals between wire harnesses. A junction block 12 has therein a bus bar circuit 12a mainly having a branch function. The unit 11 and the block 12 are respectively provided with a connector 13 for connecting the block, and a connector 14 for connecting the unit, and are electrically connected to each other through the connectors 13 and 14. A plurality of connectors 16, 16', etc., are disposed in a casing of the block 12 to functionally connect a fuse F and an external wire harness W. A plurality of connectors 15, 15', etc., are also disposed in the unit 11 to directly connect an external wire harness W'.

The functional circuit mentioned above means a circuit for controlling the operations of electrical devices mounted on a vehicle, for example, by input or output signals from various kinds of switches, sensors, etc. The functional circuit may be constituted by an alarm circuit for giving an alarm when a door is not completely closed, a wiper control unit circuit, etc. FIG. 2 shows a control section 17 for embedding elements and electronic parts such as transistors, LSI, MCP, relays, timers, etc., which are needed to control the circuit.

In the conventional wiring apparatus mentioned above, the plurality of connectors 15, 15', etc., are also disposed in the unit 11 to directly connect the external wire harness W', thereby causing the following problems:

(1) It is necessary to dispose a bus bar(through circuit) 12a' irrespective of the control section 17, as in the connector 15, for example, thereby increasing the number of parts such as connecting terminals and connector housings on the side of the unit 11, and increasing the cost of the apparatus.

(2) The through circuit 12a' and a circuit 11b for inputting and outputting signals connected to the control section 17 are disposed in a mixed state in the connectors 15' and 15" so that the structure of an internal circuit of the unit 11 is made complicated and a branch connection designated by reference numeral J is particularly made complicated.

(3) In the wiring of a vehicle, the plurality of connectors 15, 15', etc., must be connected to the unit 11, in addition to the connection between the junction block 12 and the electronic circuit unit 11, thereby increasing the number of assembly operations.

SUMMARY OF THE INVENTION

To overcome the problems mentioned above, an object of the present invention is to provide a built-in function type wiring apparatus for simplifying the circuit construction within an electronic circuit unit and reducing the number of parts and the cost.

Another object of the present invention is to provide a built-in function type wiring apparatus for reducing the number of wiring and assembly operations and improving the operability and productivity.

With the above object in view, the present invention resides in a built-in function type wiring apparatus comprising circuit unit means having a functional circuit and a signal circuit for inputting and outputting signals through external wire harnesses; junction block means including a bus bar circuit having a branch function; first and second connector means being respectively disposed in the circuit unit means and the junction block means, said signal circuit being connected onto the junction block means side through the first and second connector means with respect to an external wire harness with no route of the bus bar circuit; and third connector means for an external wire harness of the signal circuit, disposed on the junction block means side in proximity to the second connector means.

BRIEF DESCRIPTION OF THE DRAWINGS

The present invention will be more apparent from the following description of the preferred embodiments thereof in conjunction with the accompanying drawings.

DETAILED DESCRIPTION OF THE PREFERRED EMBODIMENTS

The preferred embodiments of a built-in function type wiring apparatus of the present invention will be now described in detail with reference to the accompanying drawings.

Figure 1:
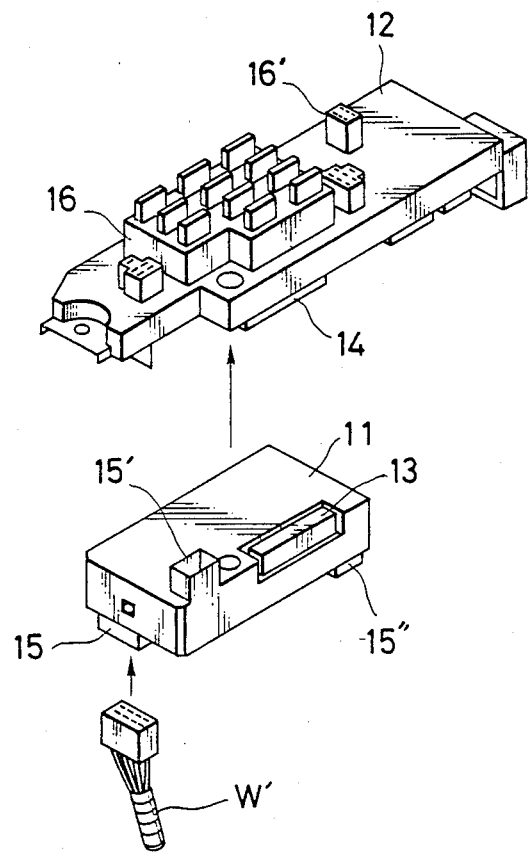
FIG. 1 is a perspective view of a conventional wiring apparatus when constructional elements are separated from each other.
Figure 2:
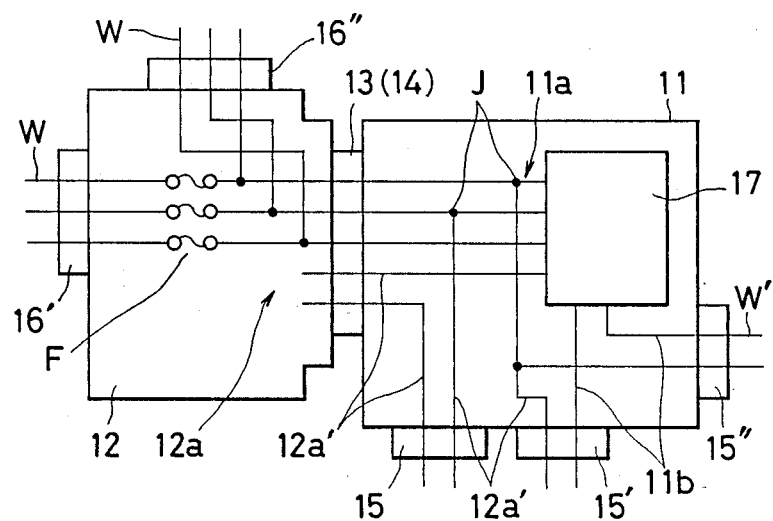
FIG. 2 is a view showing an example of the circuit construction of the conventional wiring apparatus when the constructional elements are jointed to each other.
Figure 3:
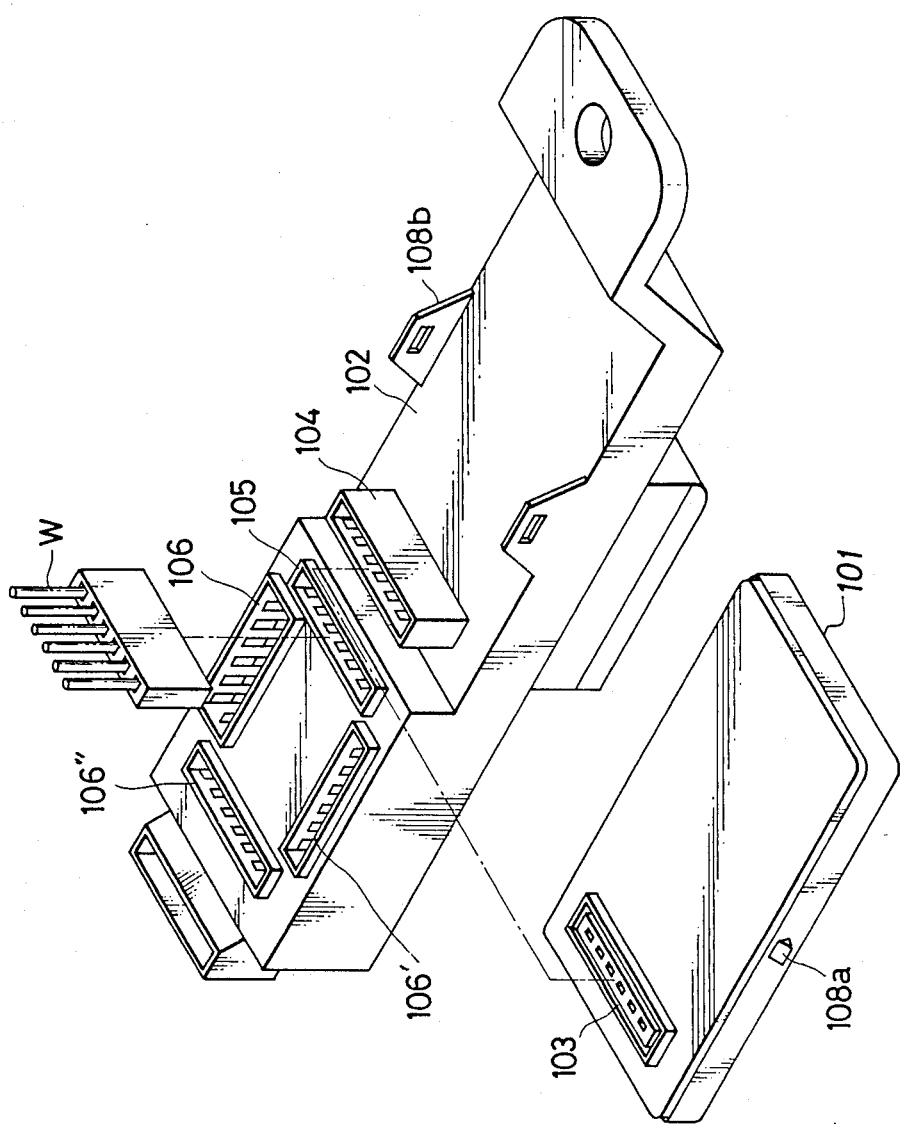
FIG. 3 is a perspective view of a wiring apparatus in accordance with an embodiment of the present invention in which constructional elements are separated from each other.
Figure 4:
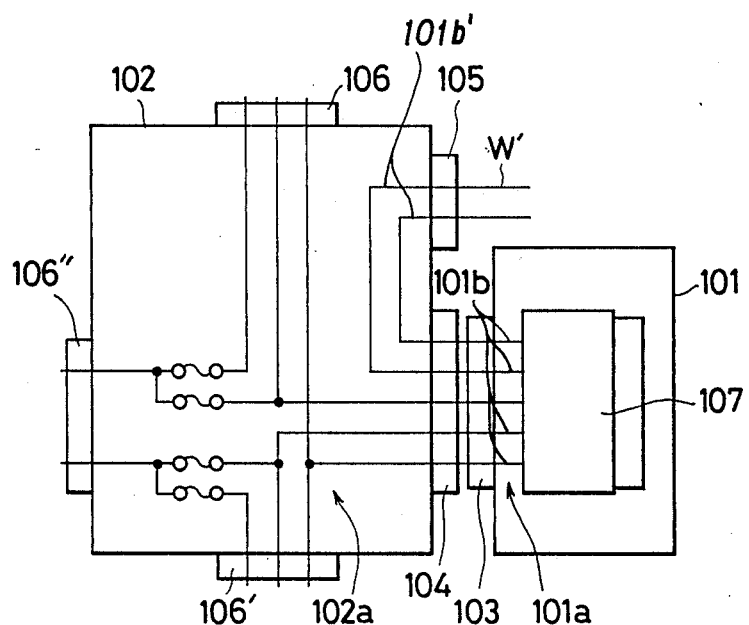
FIG. 4 is a view showing an embodiment of the circuit construction of the wiring apparatus of FIG. 3 when the constructional elements are jointed to each other.

As shown in FIGS. 3 and 4, a wiring apparatus of a function embedded type for a vehicle in accordance with the present invention comprises an electronic circuit unit 101 having a functional circuit 101a therein, a junction block 102 having a bus bar circuit 102a therein and mainly having a branch function. A connector 103 is connected to the electronic circuit unit 101 to join the junction block 102, and a connector 104 is connected to the junction block 102 to join the unit 101. An input-output signal circuit 101b for inputting and outputting signals in the electronic circuit unit 101 is connected onto the side of the junction block 102 through the connectors 103 and 104 with respect to an external wire harness W' with no route of the bus bar circuit 102a. A joining connector 105 for the external wire harness W' of the input-output signal circuit 101b is disposed on the side of the junction block 102 in proximity to the joining connector 104.

A plurality of connectors 106, 106', etc., for external wire harness W are disposed in the junction block 102 as in the conventional wiring apparatus. A control section 107 is disposed in the electronic circuit unit 101, and locking devices 108a and 108b are preferably disposed between the unit 101 and the block 102 to lock them.

As clearly seen from the figures, the electronic circuit unit 101 has no connector directly connected to the external wire harness W', and the joining connector 105 is therefore is formed on the side of the junction block 102.

Further, it is seen that input-output signal circuit 101b constitutes a first conductive path means having two ends, one end of which is connected to the control section or unit 107, and the other end of which is connected to the connector 103 for electrical connection to junction block 102 through connector 104. A second conductive path means 101b' is formed in junction block 102 for routing signals between control unit 101 and wiring harness W' without passing through bus bar circuit 102a. Second conductive path means 101b' has two ends, one end of which is connected to connector 104 and the other end of which is connected to connector 105.

Figure 5:
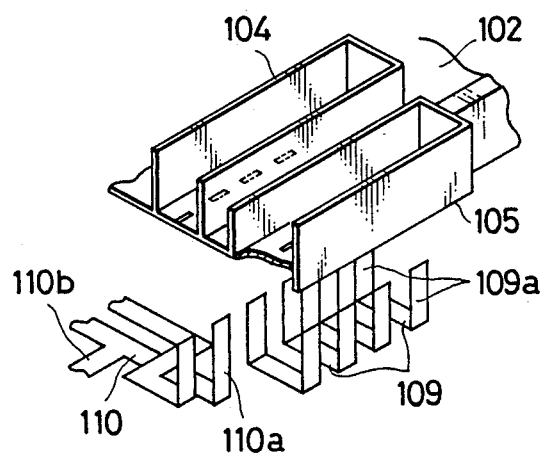
FIG. 5 is a perspective view showing the construction of joining connectors of the wiring apparatus of FIG. 3 and partially having cut-out portions.

The joining connector 105 is in proximity to the joining connector 104 of the junction block 102 for joining the unit, and is preferably adjacent to the joining connector 104. By such an arrangement, as shown in FIG. 5, the input-output signal circuit 101b constituting a portion of the functional circuit 101a of the unit 101 can be formed by short bus bars having a very simplified shape, such as U-shaped bus bars 109 each having connecting terminals 109a with tab-shaped rising portions at both ends thereof. In FIG. 5, each of normal bus bars (bus bar circuit 102a) 110 mainly constitutes an internal circuit of the junction block 102, and has a connecting terminal 110a and a branch circuit portion 110b.

When the pitch between the connecting terminals 109a of the bus bars 109 constituting the input-output signal circuit 101b is in agreement with the pitch between the connecting terminals 110a of the normal bus bars 110, the connecting terminals can be commonly applied to connectors of external wire harnesses to be connected.

Figure 6A:
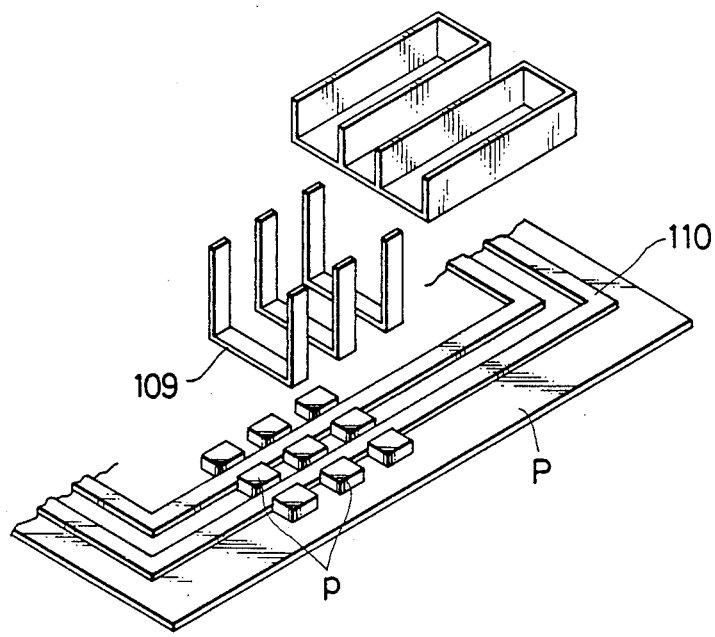
FIGS. 6A and 6B are respectively perspective and cross-sectional views showing another arrangement of bus bars in FIG. 5.
Figure 6B:
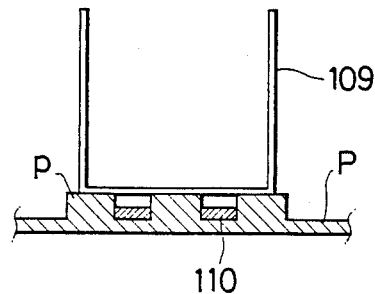

In addition, since the bus bars 109 of the input-output signal circuit 101b have a simple shape, when a plurality of spacers p are projected upwards from an insulating substrate P as shown in FIGS. 6A and 6B, it is easy to dispose the bus bars 109 on the normal bus bars 110 without adversely affecting each other.

As mentioned above, in accordance with the built-in function type wiring apparatus of the present invention, the input-output signal circuit 101b connected to an external wire harness in an electronic circuit unit 101 is separated from other circuits, thereby simplifying the circuit construction within the unit. Further, since the input-output signal circuit 101b is not related to the bus bar circuit 102a within the junction block 102, the input-output signal circuit can be formed in a simplified shape as that of the short bus bars 109 as shown in FIG. 5 without affecting the circuit construction of the bus bar circuit 102a. Accordingly, it is easy to dispose the joining connector 105 of the input-output signal circuit 101b on the side of the junction block 102.

The electronic circuit unit 101 has only the block joining connector 103, and the number of parts such as the conventional connecting terminals, connector housings, etc., can be greatly reduced, and the manufacturing cost and the number of wiring and assembly operations of a vehicle, for example, can be reduced, thereby improving the productivity.

As mentioned above, in accordance with the built-in function type wiring apparatus of the present invention, it is not necessary to dispose connectors of the input-output signal circuit and a bus bar circuit from the junction block in a mixed state thereof on the electronic circuit unit side, thereby simplifying the circuit construction within the unit and reducing the number of parts and the manufacturing cost. Further, since it is not necessary to directly connect a number of external wire harnesses to the unit, the wiring operation of the vehicle is simplified.

What is claimed is:

1. A built-in function type wiring apparatus comprising:
   a circuit unit including a control unit and first conductive path means having two ends, one end of the first conductive path means being connected to the control unit;
   a first connector means mounted on the circuit unit, connected with the other end of the first conductive path means;
   a junction block including a second connector means, second conductive path means having two ends, and a bus bar circuit means for branching signals passing through the second connector means;
   a third connector means mounted on the junction block, connected with one end of the second conductive path means, the first and third connector means being interconnectable to each other, the first and second conductive path means being interconnectable to each other through the first and third connector means; and
   a fourth connector means mounted on the junction block in a vicinity of the third connector means, connected with the other end of the second conductive path means such that signals passing through the fourth connector means can be routed to the control unit without passing through the bus bar circuit means for branching signals.

2. A wiring apparatus as claimed in claim 1, wherein the second connector means is also mounted on the junction block and is interconnectable to the circuit unit.

3. A wiring apparatus as claimed in claim 1, wherein the second conductive path means comprises bus bars.

4. A wiring apparatus as claimed in claim 3, wherein end portions of the bus bars forming the second conductive path means comprise connecting terminals, and a pitch of the connecting terminals is identical with that of connecting terminals of the bus bar circuit.

5. A wiring apparatus as claimed in claim 3, wherein the bus bars forming the second conductive path means are disposed above the bus bars of the bus bar circuit.

6. A wiring apparatus as claimed in claim 3, wherein the bus bars forming the second conductive path means are U-shaped.

* * * * *